(12) United States Patent
Hausmann et al.

(10) Patent No.: US 8,447,256 B2
(45) Date of Patent: May 21, 2013

(54) DIGITAL VOLTAGE-CONTROLLED ATTENUATOR

(75) Inventors: Kurt B. Hausmann, Chandler, AZ (US); Omid Oliaei, Tempe, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 105 days.

(21) Appl. No.: 13/207,649

(22) Filed: Aug. 11, 2011

(65) Prior Publication Data

US 2013/0040591 A1 Feb. 14, 2013

(51) Int. Cl.
*H04B 1/18* (2006.01)
*H03H 5/00* (2006.01)
*H01P 1/00* (2006.01)

(52) U.S. Cl.
USPC ........... 455/289; 455/290; 455/292; 455/340; 333/25; 333/253; 333/263

(58) Field of Classification Search
USPC ................. 455/280, 286, 287, 289, 290, 292, 455/293, 340; 333/25, 26, 180, 253, 263
See application file for complete search history.

(56) References Cited

U.S. PATENT DOCUMENTS

| | | | | |
|---|---|---|---|---|
| 5,251,030 A * | 10/1993 | Tanaka | ...................... | 375/240.16 |
| 5,572,162 A | 11/1996 | Cotreau | ........................ | 327/552 |
| 6,009,318 A * | 12/1999 | Freed | ............................ | 455/326 |
| 6,239,668 B1 * | 5/2001 | Menna et al. | .................... | 333/25 |
| 6,657,481 B2 | 12/2003 | Rasmussen et al. | .......... | 327/540 |
| 7,218,170 B1 | 5/2007 | Carter et al. | .................... | 327/552 |
| 7,253,700 B1 * | 8/2007 | Chiu | ............................ | 333/81 R |
| 7,660,571 B2 * | 2/2010 | Chang et al. | .................. | 455/324 |
| 8,058,948 B2 * | 11/2011 | Rijssemus | ..................... | 333/124 |
| 2008/0297661 A1 * | 12/2008 | Kitaguchi | ..................... | 348/705 |
| 2010/0027711 A1 | 2/2010 | Manku et al. | ................. | 375/295 |
| 2010/0295599 A1 | 11/2010 | Uehara et al. | ................. | 327/355 |
| 2012/0139658 A1 * | 6/2012 | Mu | ................................ | 333/25 |

OTHER PUBLICATIONS

U.S. Appl. No. 12/882,306; pp. 22, Sep. 15, 2010.
Wikipedia; "Resistor ladder"; www.wikipedia.org; pp. 3, Jul. 14, 2011.
Wikipedia; "Balun"; www.wikipedia.org; pp. 4, Jul. 14, 2011.
Roy W. Lewallen; "Baluns: What They Do and How They Do It"; APRL Antenna Compendium, vol. 1; pp. 157-164, 1985.
Farazian et al. "A Dual-Band CMOS CDMA Transmitter Without External SAW Filtering"; IEEE Transactions on Microwave Theory and Techniques; vol. 58; No. 5; pp. 1349-1358, May 2010.
Farazian et al. "A Dual-Band CMOS CDMA Transmitter Without SAW and Driver Amplifier"; IEEE Radio Frequency Integrated Circuits Symposium; pp. 523-526, 2009.

* cited by examiner

*Primary Examiner* — Duc M Nguyen
(74) *Attorney, Agent, or Firm* — Baker Botts L.L.P.

(57) ABSTRACT

In accordance with some embodiments of the present disclosure an attenuating circuit comprises a balun configured to receive a radio frequency (RF) signal at first and second input ports and configured to output the RF signal. The circuit further comprises an attenuator coupled in parallel with the first and second input ports. A power level of the RF signal output by the balun is based at least partially on an impedance of the attenuator. The attenuator comprises a resistor ladder configured to receive at least a portion of the RF signal and a plurality of switches coupled to the resistor ladder. The plurality of switches are configured to open and close such that the impedance of the attenuator is a function of which switches are open and closed. Therefore, the power of the RF signal is controlled based at least on the opening and closing of the switches.

22 Claims, 5 Drawing Sheets

DIGITAL VOLTAGE-CONTROLLED ATTENUATOR

TECHNICAL FIELD

The present disclosure relates generally to attenuators, including, without limitation, a digital voltage-controlled radio frequency signal attenuator.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. A receiver is an electronic device which receives and processes a wireless electromagnetic signal. A transmitter and receiver may be combined into a single device called a transceiver.

The gain of a signal amplifier may be associated with a radio frequency signal (RF attenuator) of the amplifier. However, current implementations of RF attenuators may not provide a linear attenuation over a desired attenuation range.

SUMMARY

In accordance with some embodiments of the present disclosure an attenuating circuit comprises a balun configured to receive a radio frequency (RF) signal at a first input port and a second input port and configured to output the RF signal. The circuit further comprises an attenuator coupled in parallel with the first and second input ports of the balun. A power level of the RF signal output by the balun is based at least partially on an impedance of the attenuator, as experienced by the RF signal. The attenuator comprises a resistor ladder configured to receive at least a portion of the RF signal and a plurality of switches coupled to the resistor ladder. The plurality of switches are configured to open and close according to a digital control signal received by the switches such that the impedance of the attenuator, as experienced by the RF signal, is a function of which switches are open and which switches are closed. Therefore, the power of the RF signal output by the balun is controlled based at least on the opening and closing of the switches.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
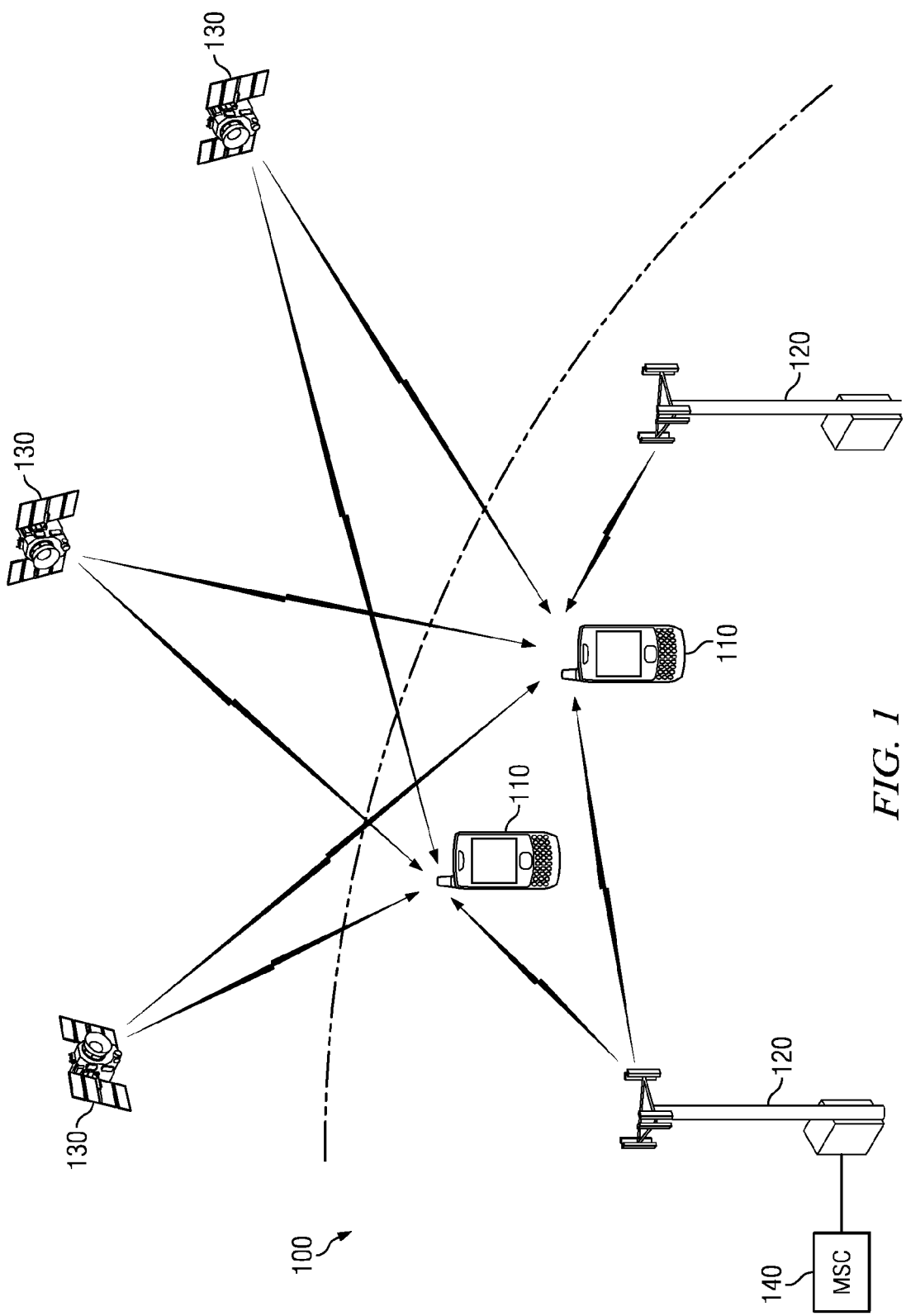
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source that may transmit signals to a variety of receiving sources, such as a base station 120. As disclosed in further detail below, a terminal 110 may include a variable gain amplifier (VGA) configured to amplify a transmitted signal according to the input impedance of an attenuator included in the VGA. As described below, the attenuator may include an R2R resistor ladder that may be used to vary the input impedance of the attenuator. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
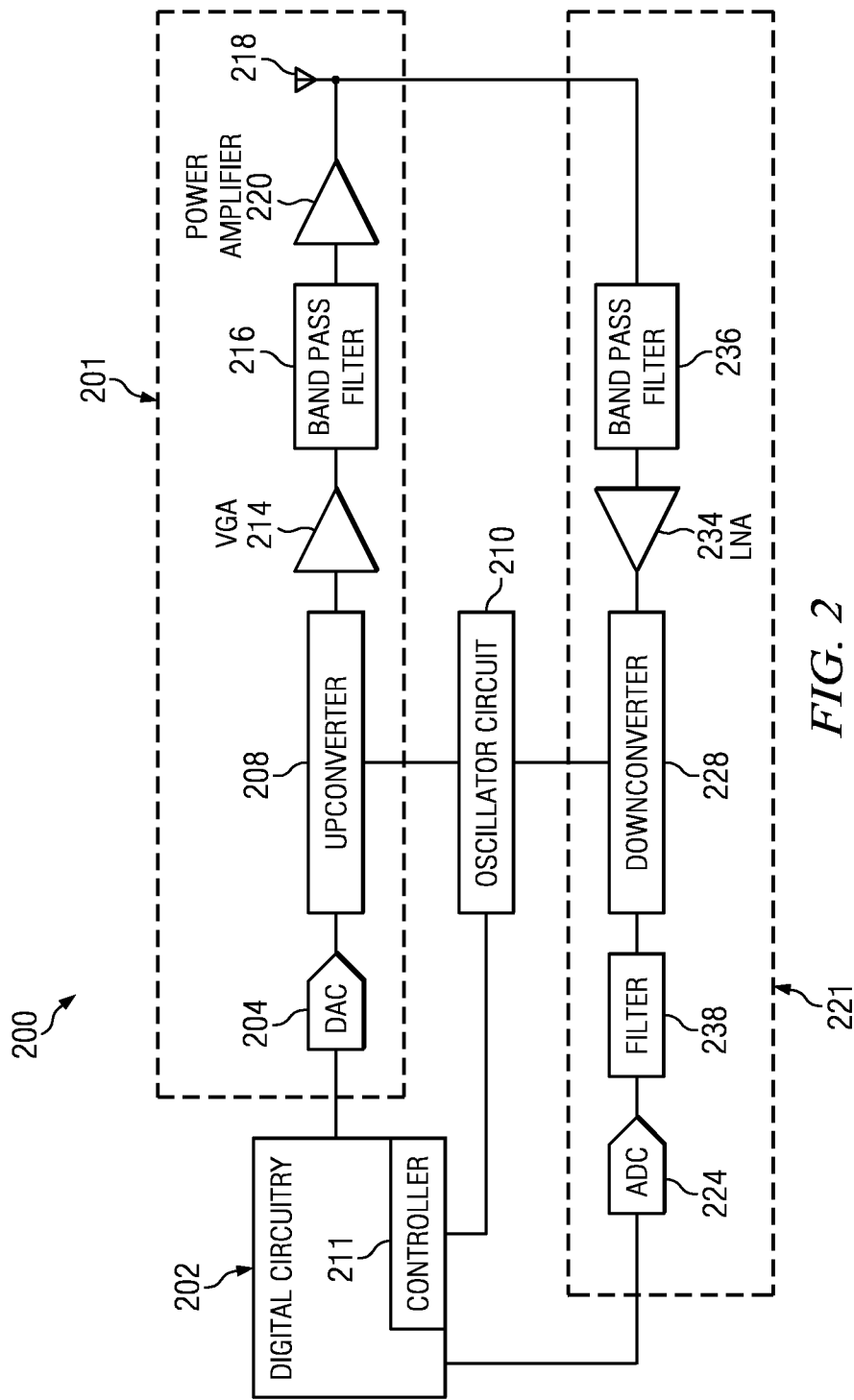
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices. In the present embodiment, digital circuitry 202 may include a controller 211. As disclosed in further detail below, controller 211 may be configured to communicate control signals VGA 214 (described below) to adjust the input impedance of an attenuator included in VGA 214.

Controller 211 may comprise any system, device, or apparatus configured to interpret and/or execute program instructions and/or process data, and may include without limitation a microprocessor, microcontroller, digital signal processor (DSP), application specific integrated circuit (ASIC), or any other digital or analog circuitry configured to interpret and/or execute program instructions and/or process data. In some embodiments, controller 211 may interpret and/or execute program instructions and/or process data stored in memory communicatively coupled to controller 211 (not expressly shown).

Memory may comprise any system, device or apparatus operable to retain program instructions or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to controller 211 is turned off.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208. Upconverter 208 may be configured to frequency upconvert an analog signal received from DAC 204 to a wireless communication signal at a radio frequency based on an oscillator signal provided by oscillator circuit 210.

Oscillator circuit 210 may be any suitable device, system, or apparatus configured to produce an analog waveform of a particular frequency for modulation or upconversion of an analog signal to a wireless communication signal, or for demodulation or downconversion of a wireless communication signal to an analog signal. Accordingly, oscillator circuit 210 may produce a clock signal that may be used for modulation or demodulation.

Transmit path 201 may include VGA 214 to amplify an upconverted signal for transmission. As mentioned above, and described further below, VGA 214 may include an attenuator with an R2R ladder configured to vary the impedance of the attenuator, which in turn may vary the gain of VGA 214. The impedance of the attenuator may be controlled by controller 211 according to the desired gain of VGA 214 such that the RF signal is transmitted a desired power level. VGA 214 may communicate the amplified signal to a bandpass filter 216 of transmit path 201. Bandpass filter 216 may be configured to receive an amplified signal from VGA 214 and pass signal components in the band of interest and remove out-of-band noise and undesired signals.

The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
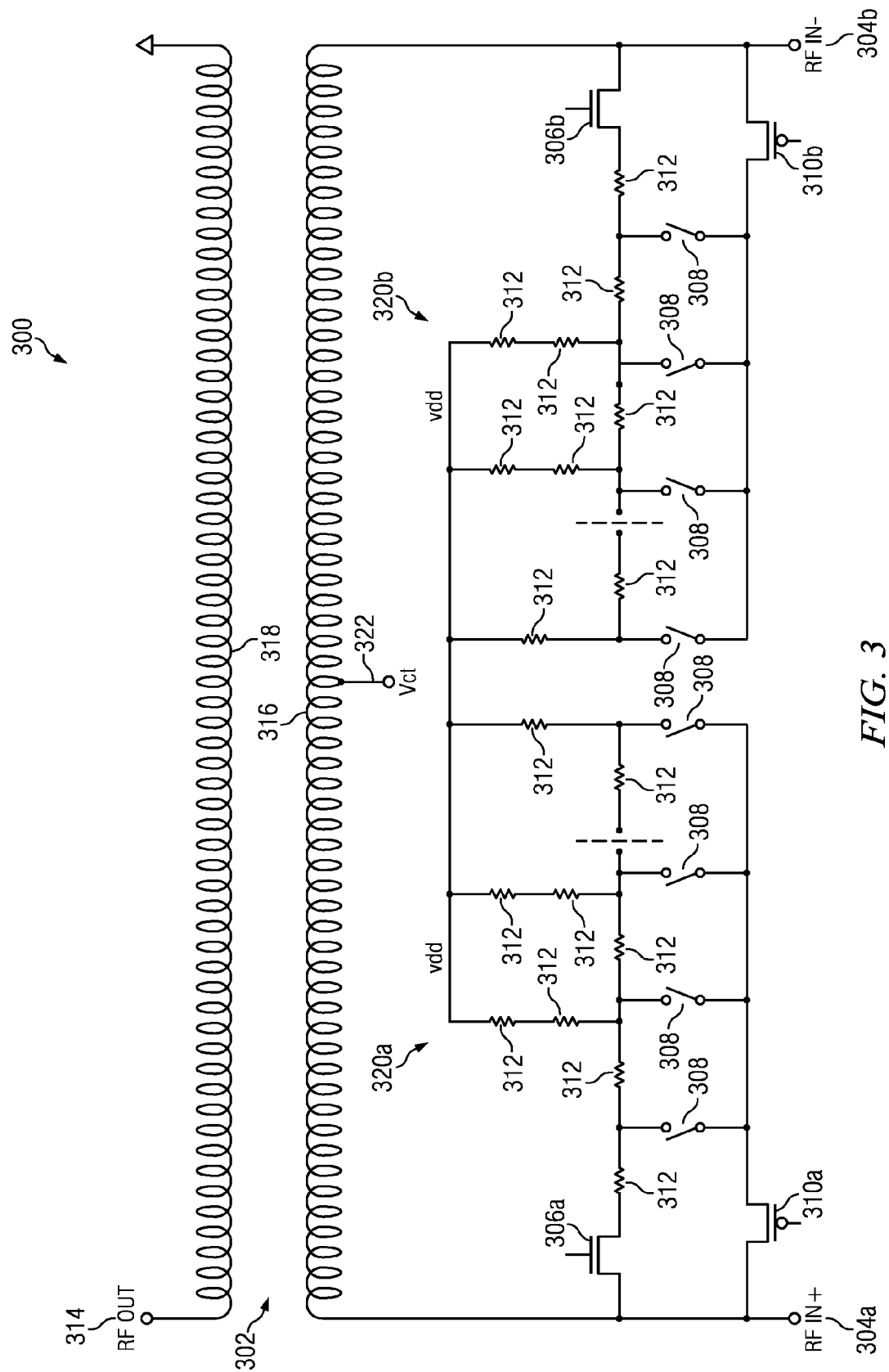
FIG. 3 illustrates an example of a digital voltage-controlled attenuator, in accordance with certain embodiments of the present disclosure.

FIG. 3 illustrates an example of a digital voltage-controlled attenuator (DVCA) 300, in accordance with certain embodiments of the present disclosure. In the present example DVCA 300 may be included in a VGA (e.g., VGA 214 of FIG. 2) to control the gain of the VGA, which may in turn control the power of a transmitted RF signal.

In the present example DVCA 300 may be placed in parallel with a transformer 302 that may act as a balun. A balun may comprise any suitable system, apparatus or device configured to convert differential signals into single-ended signals and vice versa. In the present example, transformer 302 may include an input coil 316 and an output coil 318. Input coil 316 may include input ports 304a and 304b configured to receive a positive differential RF current and negative differential RF current, respectively of an RF signal received at the VGA associated with DVCA 300 and transformer 302 (e.g., VGA 214). Output coil 318 may include an output port 314 configured to output the RF signal as a single-ended RF signal. In the present example, output port 314 may be associated with the output of a VGA (e.g., VGA 214) for transmission from a wireless communication element, such as element 200 of FIG. 2. The power of the RF signal transmitted from output port 314 may be at least a function of the RF differential current flowing through output coil 318, which may be a function of the current flowing through input coil 316. Additionally, the power of the RF signal transmitted from output coil 318 via output port 314 may also be a function of a bias voltage of input coil 316. Accordingly, the power of an RF signal that may be output at output port 314 may be adjusted by adjusting at least one of the differential RF current passing through input coil 316 and the bias voltage of input coil 316.

As disclosed further below, DVCA 300 may be enabled and disabled to dissipate at least a portion of the power of the RF signal received at input ports 304a and 304b by drawing at least a portion of the RF differential current away from input coil 316. DVCA 300 may also be configured to draw differing amounts of RF differential current through DVCA 300 by varying its impedance (as experienced by the RF signal) such that a portion of the power of the RF signal received at input ports 304a and 304b may be dissipated within DVCA 300 according to the varied impedance. Therefore, the current passing through input coil 316 and output coil 318 may vary according to the impedance changes of DVCA 300 such that the power of the RF signal output at output port 314 may be varied.

Additionally, input coil 316 may be coupled to a center tap voltage (Vct) 322 that may be adjusted to change the bias voltage of input coil 316. When the power of the RF signal passing through input coil 316 is increased, the voltage of Vct may be increased, to provide sufficient voltage headroom due to the voltage swings of the RF signal. Additionally, when the RF signal power is decreased, Vct 322 may be decreased, because less bias voltage may be needed to provide sufficient voltage headroom due to the voltage swings of the RF signal being smaller. In some embodiments, Vct 322 may be adjusted on a sliding scale, and in other embodiments, Vct 322 may be able to be selected from two or more of a set voltages. In yet other embodiments, Vct 322 may be a fixed voltage that may not be adjusted.

DVCA 300 may include switches 306 and 310 coupled to input ports 304 of input coil 316. In the present embodiment, switches 306 may comprise n-type metal-oxide-semiconductor field-effect transistors (NMOS) and switches 310 may comprise p-type metal-oxide-semiconductor field-effect transistors (PMOS) configured to open and close according to a control signal sent from a controller, such as controller 211 of FIG. 2. Switches 306a and 306b may close in response to receiving a "HIGH" control signal at their respective gates and may open in response to receiving a "LOW" control signal due to switches 306a and 306b being NMOS devices in the present example. Switches 310a and 310b may close in response to receiving a "LOW" control signal and may open in response to receiving a "HIGH" control signal at their respective gates due to switches 310a and 310b being PMOS devices in the present example.

In instances where no attenuation of the RF signal is desired, switches 306 and 310 may be opened to decouple DVCA 300 from input coil 316 such that no RF differential current is drawn through DVCA 300. Therefore, DVCA 300 may be disabled and all the RF current may be drawn through input coil 316 and output coil 318 such that all of the power of the RF signal may be output at output node 314.

To provide further power control, DVCA 300 may be enabled in some instances. DVCA 300 may be enabled by switches 306 and 310 receiving control signals from a controller (e.g., controller 211) to close switches 306 and 310. As such, at least a portion of the RF signal received at input ports 304 may pass through DVCA 300 (e.g., in the present example a portion of the RF differential current may pass through DVCA 300) such that less RF power may be transferred to output port 314 (e.g., less RF current may pass through coils 316 and 318, thus reducing the power of the RF signal outputted at output port 314).

Further, the impedance of DVCA 300 may also be adjusted such that the RF differential current, and consequently the RF power passing through DVCA 300 may be adjusted. For example, DVCA 300 may include an R2R resistor ladder 320a associated with the positive differential RF current and DVCA 300 may include an R2R resistor ladder 320b associated with the negative differential RF current. Each R2R ladder 320 may include one or more resistors 312 and one or more switches 308 that may open and close according to control signals received from a controller (e.g., controller 211). Each switch 308 may be configured to open or close to decouple or couple, respectively, one or more resistors 312 to a path that may be followed by the RF signal through DVCA 300. In the present example, switches 308 may comprise PMOS devices, however any other suitable system, apparatus or device may be used for switches 308.

Therefore, as each switch 308 opens and/or closes the overall impedance of DVCA 300, with respect to the RF signal passing through DVCA 300, may change such that the RF current passing through DVCA 300 may change. As mentioned above, the RF power may be a function of the RF current. Accordingly, the amount of RF signal power dissipated through DVCA 300 (instead of passing through input coil 316) may be a function of the impedance of DVCA 300, which may be based on the opening and closing of switches 308. As such, a controller may adjust the attenuation of an RF signal output at output port 314 by opening and/or closing the appropriate switches 308. Additionally, in some instances, Vct 322 may be reduced to be set at the supply voltage (vdd) of DVCA 300 when DVCA 300 is enabled. Vct 322 may be reduced when DVCA 300 is enabled because the bias voltage at input coil 316 may not need to be as high due to the lower power of the RF signal. Such a configuration may allow for a more linear adjustment of RF signal power over a larger dynamic range of RF signal power attenuation than traditional RF signal attenuation configurations. Further, in some instances when Vct is set to a lower voltage because less RF signal power is needed (e.g., during attenuation by DVCA 300), the amount of total power used by the system may be decreased when less RF signal power is desired because of the current reduction.

Modifications, additions or omissions may be made to the system of FIG. 3 without departing from the scope of the present disclosure. For example, although the present embodiment depicts DVCA 300 in parallel with a transformer 302 acting as a balun, it is understood that DVCA 300 may be placed in parallel with any suitable balun to achieve a linear attenuation over a larger dynamic range. Additionally, although switches 306 and 310 are depicted specifically as NMOS and PMOS devices, respectively, it is understood that any suitable switch may be used to perform the switching functions performed by switches 306 and 310. Also, switches 306 may comprise PMOS devices and switches 310 may comprise NMOS devices or any combination thereof. Additionally, as described in FIG. 4, in some instances, switches 310 may be omitted. Further, although the present example of DVCA 300 is described with respect to an RF signal that is to be transmitted (e.g., via transmit path 201 of FIG. 2), it is understood that DVCA 300 may be configured to adjust an RF signal that may be received (e.g., via receive path 221).

Figure 4:
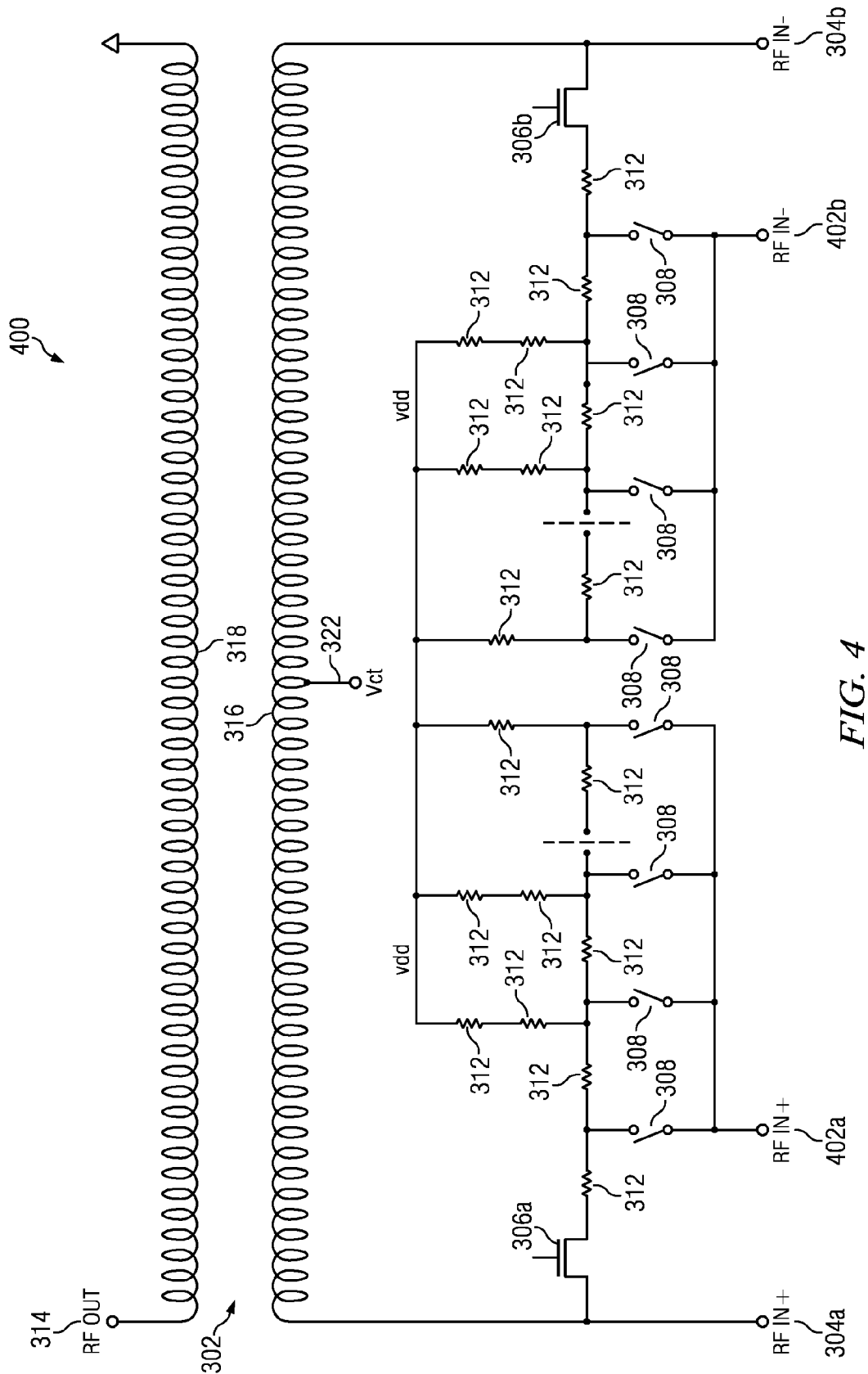
FIG. 4 illustrates another example of a digital voltage-controlled attenuator, in accordance with certain embodiments of the present disclosure.

FIG. 4 illustrates another example of a DVCA 400 in accordance with the present disclosure. FIG. 4 may include transformer 302 with input coil 316 and output coil 318 as described with respect to FIG. 3. Additionally, input coil 316 may include input ports 304 configured to receive the differential RF current of an RF signal, as described with respect to FIG. 3. Further, similarly to that described in FIG. 3, input coil 316 may be communicatively coupled to a center tap voltage Vct 322 at approximately the center of input coil 322 to bias input coil 316. As described above with respect to FIG. 3, in some embodiments Vct 322 may be varied to according to the output power of an RF signal output at output port 314 to reduce power consumption.

Similar to the description of FIG. 3, DVCA 400 may be placed in parallel with transformer 302. DVCA 400 may include switches 306 configured to enable and disable DVCA 400 by closing and opening, respectively, such that DVCA 400 may be coupled to or decoupled from transformer 302, as described above. DVCA 400 may also include resistors 312 and switches 308 configured to open and close to vary the impedance of DVCA 400 as described with respect to FIG. 3.

However, unlike DVCA 300 of FIG. 3, DVCA 400 of FIG. 4 may include input terminals 402a and 402b configured to receive the positive and negative differential currents, respectively, of an RF signal. Accordingly, DVCA 400 may not include switches 310 shown in FIG. 3. In the current embodiment of DVCA 400, the RF signal received at input terminals 402a and 402b may be generated by the same RF signal source as the RF signal that may be received at ports 304a and 304b. In other embodiments, the RF signal received at terminals 402a and 402b may be generated by a different source than the source that may generate the RF signal received at ports 304a and 304b. The RF signal source or sources may be included in upconverter 208 of FIG. 2.

In instances where no attenuation due to DVCA 400 is desired, a controller (e.g., controller 211) may open switches 306 and may also direct the RF signal to ports 304a and 304b. In such instances, the controller may also direct that no RF signal is sent to terminals 402 of DVCA 400. In instances where attenuation due to DVCA 400 is desired, a controller (e.g., controller 211) may close switches 306 and may also direct that the RF signal is sent to terminals 402 of DVCA 400. In such instances, the controller may also direct that no RF signal is sent to ports 304. The RF signal may be directed between input ports 304 and input terminals 402 by cascoded devices (e.g., CMOS devices) coupled to the RF signal source and configured to steer the RF current into either input ports 304 or input terminals 402 depending on whether DVCA 300 is disabled or enabled, respectively. As described above, with DVCA 400 enabled, different switches 308 may be opened or closed to adjust the impedance of DVCA 400 such that the power of the RF signal being output at output port 314 may be adjusted.

Accordingly, DVCA 400 may be configured to adjust the attenuation of an RF signal, passing through a VGA such that the DVCA 400 may be configured to adjust the gain of the VGA. Further, by including input terminals 402 in DVCA 400 instead of switches 310 in DVCA 300, possible insertion loss due to switches 310 may be avoided.

Modifications, additions or omissions may be made to the system of FIG. 4 without departing from the scope of the present disclosure. For example, although the present embodiment depicts DVCA 400 in parallel with a transformer 302 acting as a balun, it is understood that DVCA 400 may be placed in parallel with any suitable balun to achieve a linear attenuation over a larger dynamic range than traditional attenuation configurations. Additionally, although switches 306 are depicted specifically as NMOS, it is understood that any suitable switch may be used to perform the switching functions performed by switches 306. For example, in some embodiments, switches 306 may comprise PMOS devices instead of NMOS devices. Additionally, as described with respect to FIG. 5, in some instances DVCA 400 may be configured to account for possible current leakage through switches 306.

Figure 5:
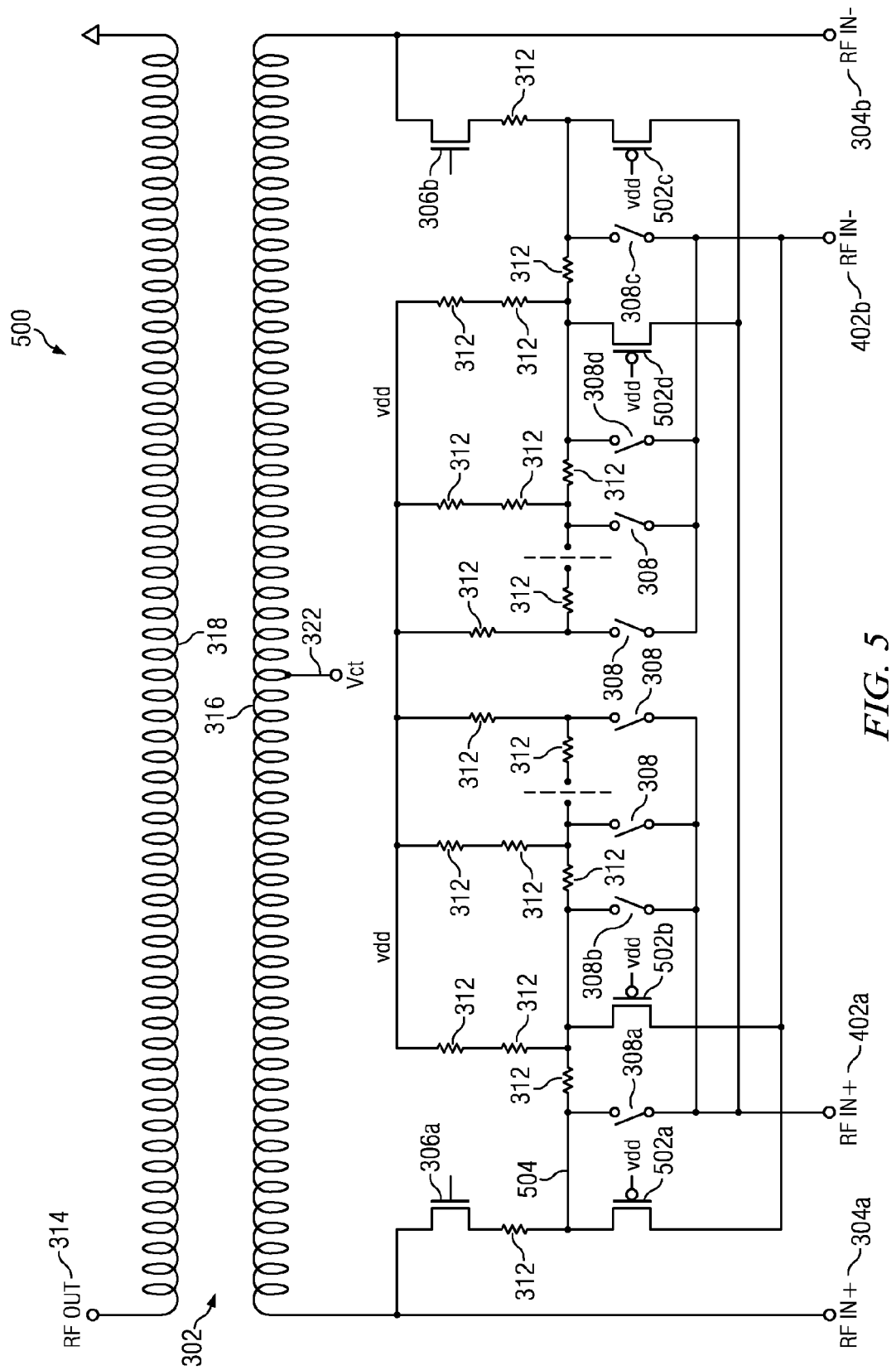
FIG. 5 illustrates an example of a digital voltage-controlled attenuator with leakage cancellation, in accordance with certain embodiments of the present disclosure.

FIG. 5 illustrates an example of a DVCA 500 with leakage cancellation, in accordance with certain embodiments of the present disclosure. DVCA 500 may be coupled in parallel with input coil 316 of transformer 302 as described above with respect to DVCA 300 and DVCA 400 in FIGS. 3 and 4, respectively. Additionally, DVCA 500 may be substantially similar to DVCA 400 of FIG. 4, however, unlike DVCA 400, DVCA 500 may be configured to compensate for any current leakage that may occur through switches 308 when switches 308 are opened and DVCA 500 is enabled.

Similarly to DVCA 400, DVCA 500 may be enabled by closing switches 306. Additionally, input terminals 402 of DVCA 500 may receive the RF signal when DVCA 500 is enabled. As described above, to adjust the impedance of DVCA 500, switches 308 may be opened or closed. However, when switches 308 are opened, some current may leak through one or more of the open switches 308, thus causing those switches to not act as if they are completely open.

Accordingly, DVCA 500 may include one or more dummy switches 502 that may compensate for some or all of the current leakage that may pass through a respective switch 308 when the switch 308 is "open." For example, dummy switch 502a may be associated with switch 308a and may be configured to compensate for current leakage through switch 308a when switch 308a is "open." Dummy switches 502b, 502c and 502d may be similarly associated with switches 308b, 308c and 308d respectively. In the present example, dummy switches 502 may comprise PMOS devices with their gates tied to source voltage vdd such that dummy switches 502 may always be turned off. In alternate examples, one or more of dummy switches 502 may comprise NMOS devices with their gates tied to ground such that the NMOS dummy switches 502 may also always be turned off.

Dummy switches 502 may be configured to have leakage currents that may have an opposite polarity from the polarity of the leakage currents flowing through an associated switch 308. Accordingly, the leakage currents of dummy switches 502 may be used to partially or fully cancel leakage current of an associated switch 308.

For example, switch 308a may be coupled at one end to a node 504 of DVCA 500 also and may be coupled to input terminal 402a at its other end. As mentioned above, input terminal 402a may be configured to receive the positive differential RF current of the RF signal when DVCA 500 is enabled. Accordingly, any leakage current that may pass through switch 308a from input terminal 402a to node 504 may have a positive polarity. Additionally, dummy switch 502a may be coupled at one end to node 504 of DVCA 500 and may be coupled to input terminal 402b at its other end. As mentioned above, input terminal 402b may be configured to receive the negative differential RF current of the RF signal when DVCA 500 is enabled. Accordingly, any leakage current that may pass through dummy switch 502a from input terminal 402b to node 504 may have a negative polarity, which may be opposite of the positive polarity of the leakage current associated with switch 308a. Further, dummy switch 502a may be sized such that the amount of leakage current that may flow through dummy switch 502a may be approximately the same as the amount of leakage current passing through switch 308a.

Accordingly, with the leakage currents associated with switches 502a and 308a at node 504 being approximately equal and having opposite polarities, the leakage currents may partially or fully cancel each other out. Dummy switches 502b, 502c and 502d may be similarly configured with respect to switches 308b, 308c, and 308d. Consequently, DVCA 500 may be configured to adjust the power of the RF signal output at output port 314 similarly to DVCA 400 described with respect to FIG. 4 and may also be configured to compensate for current leakage that may occur through switches 308.

Modifications, additions or omissions may be made to DVCA 500 without departing from the scope of the present disclosure. For example, although the present embodiment depicts DVCA 500 in parallel with a transformer 302 acting as a balun, it is understood that DVCA 500 may be placed in parallel with any suitable balun to achieve a linear attenuation over a larger dynamic range than traditional attenuation configurations. Additionally, although switches 306 are depicted specifically as NMOS, it is understood that any suitable switch may be used to perform the switching functions performed by switches 306. For example, in some embodiments, switches 306 may comprise PMOS devices instead of NMOS devices. Further, although a certain number of dummy switches 502 are depicted as being associated with a certain number of switches 308, more or fewer dummy switches 502 may be included in DVCA 500 depending on the system characteristics and requirements of DVCA 500.

Although the present disclosure has been described with several embodiments, various changes and modifications may be suggested to one skilled in the art. It is intended that the present disclosure encompass such changes and modifications as fall within the scope of the appended claims.

What is claimed is:

1. A circuit comprising:
   a balun configured to receive a radio frequency (RF) signal at a first input port and a second input port and configured to output the RF signal; and
   an attenuator coupled in parallel with the first and second input ports of the balun, a power level of the RF signal output by the balun based at least partially on an impedance of the attenuator, as experienced by the RF signal, the attenuator comprising:
      a resistor ladder configured to receive at least a portion of the RF signal; and
      a plurality of switches coupled to the resistor ladder and configured to open and close according to a digital control signal received by the switches such that the impedance of the attenuator, as experienced by the RF signal, is a function of which switches are open and which switches are closed such that the power of the RF signal output by the balun is controlled based at least on the opening and closing of the switches.

2. The circuit of claim 1, further comprising:
   a first enable switch coupled between the first input port of the balun and a first node of the attenuator and;
   a second enable switch coupled between the second input port of the balun and a second node of the attenuator, the first and second enable switches configured to:
      open in response to receiving a disable signal to decouple the first node of the attenuator from the first input port of the balun and to decouple the second node of the attenuator from the second input port of the balun such that the attenuator is disabled; and
      close in response to receiving an enable signal to couple the first node of the attenuator to the first input port of the balun and to couple the second node of the attenuator to the second input port of the balun such that the attenuator is enabled.

3. The circuit of claim 2, the first and second enable switches comprising at least one of a p-type metal-oxide-semiconductor (PMOS) device and an n-type metal-oxide-semiconductor (NMOS) device.

4. The circuit of claim 1, the attenuator further including a first input terminal and a second input terminal coupled to the resistor ladder and configured to receive the RF signal when the attenuator is enabled.

5. The circuit of claim 1, the balun further comprising a center tap terminal coupled to a center tap voltage, a voltage level of the center tap voltage based at least partially on the power level of the RF signal received by the balun.

6. The circuit of claim 5, the center tap voltage configured to be adjusted according to the power level of the RF signal received by the balun.

7. The circuit of claim 1, the balun comprising a transformer.

8. The circuit of claim 1, the attenuator further configured to compensate for current leakage of at least one of the plurality of switches.

9. A wireless communication element comprising:
   digital circuitry configured to generate a digital signal; and
   a transmit path configured to convert a digital signal into a radio frequency (RF) signal, based at least on an oscillator signal and transmit the RF signal, the transmit path comprising a circuit that includes:
      a balun configured to receive the RF signal at a first input port and a second input port and configured to output the RF signal; and
      an attenuator coupled in parallel with the first and second input ports of the balun, a power level of the RF signal output by the balun based at least partially on an impedance of the attenuator, as experienced by the RF signal, the attenuator comprising:
         a resistor ladder configured to receive at least a portion of the RF signal; and
         a plurality of switches coupled to the resistor ladder and configured to open and close according to a digital control signal received by the switches such that the impedance of the attenuator, as experienced by the RF signal, is a function of which switches are open and which switches are closed such that the power of the RF signal output by the balun is controlled based at least on the opening and closing of the switches.

10. The wireless communication element of claim 9, the variable gain amplifier further including:
    a first enable switch coupled between the first input port of the balun and a first node of the attenuator and;
    a second enable switch coupled between the second input port of the balun and a second node of the attenuator, the first and second enable switches configured to:
       open in response to receiving a disable signal to decouple the first node of the attenuator from the first input port of the balun and to decouple the second node of the attenuator from the second input port of the balun such that the attenuator is disabled; and
       close in response to receiving an enable signal to couple the first node of the attenuator to the first input port of the balun and to couple the second node of the attenuator to the second input port of the balun such that the attenuator is enabled.

11. The wireless communication element of claim 10, the first and second enable switches comprising at least one of a p-type metal-oxide-semiconductor (PMOS) device and an n-type metal-oxide-semiconductor (NMOS) device.

12. The wireless communication element of claim 9, the attenuator further including a first input terminal and a second input terminal coupled to the resistor ladder and configured to receive the RF signal when the attenuator is enabled.

13. The wireless communication element of claim 9, the balun further comprising a center tap terminal coupled to a center tap voltage, a voltage level of the center tap voltage based at least partially on the power level of the RF signal received by the balun.

14. The wireless communication element of claim 13, the center tap voltage configured to be adjusted according to the power level of the RF signal received by the balun.

15. The wireless communication element of claim 9, the balun comprising a transformer.

16. The wireless communication element of claim 9, the attenuator further configured to compensate for current leakage of at least one of the plurality of switches.

17. A method for controlling a power level of a radio frequency (RF) signal comprising:
receiving a radio frequency (RF) signal at a first input port of a balun and a second input port of the balun;
coupling an attenuator in parallel with the first and second input ports of the balun, the attenuator comprising a resistor ladder configured to receive at least a portion of the RF signal and a plurality of switches coupled to the resistor ladder;
outputting the RF signal at an output port of the balun, a power level of the RF signal output by the balun based at least partially on an impedance of the attenuator, as experienced by the RF signal; and
adjusting the impedance of the attenuator, as experienced by the RF signal, by opening or closing at least one of the plurality of switches of the attenuator such that the power of the RF signal output by the balun is controlled based at least on the opening or closing of the at least one switches.

18. The method of claim 17, further comprising:
enabling the attenuator by closing a first enable switch coupled between the first input port of the balun and a first node of the attenuator and closing a second enable switch coupled between the second input port of the balun and a second node of the attenuator; and
disabling the attenuator by opening the first and second enable switches.

19. The method of claim 17, further comprising receiving the RF signal at a first input terminal of the attenuator and a second input terminal of the attenuator, when the attenuator is enabled.

20. The method of claim 17, further comprising adjusting a center tap voltage coupled to the balun based at least on the power level of the RF signal.

21. The method of claim 17, further comprising compensating for current leakage of at least one of the plurality of switches.

22. A wireless communication element comprising:
a receive path configured to receive a radio frequency (RF) signal and convert the RF signal into a digital signal based at least on an oscillator signal, the receive path comprising a circuit that includes:
a balun configured to receive the RF signal at a first input port and a second input port and configured to output the RF signal; and
an attenuator coupled in parallel with the first and second input ports of the balun, a power level of the RF signal output by the balun based at least partially on an impedance of the attenuator, as experienced by the RF signal, the attenuator comprising:
a resistor ladder configured to receive at least a portion of the RF signal; and
a plurality of switches coupled to the resistor ladder and configured to open and close according to a digital control signal received by the switches such that the impedance of the attenuator, as experienced by the RF signal, is a function of which switches are open and which switches are closed such that the power of the RF signal output by the balun is controlled based at least on the opening and closing of the switches.

* * * * *